United States Patent
Jung

(10) Patent No.: US 9,940,185 B2
(45) Date of Patent: Apr. 10, 2018

(54) INTELLIGENT BATTERY SENSOR FOR VEHICLE AND METHOD OF STORING DATA IN SENSOR

(71) Applicant: HYUNDAI MOBIS Co., Ltd, Seoul (KR)

(72) Inventor: Ji Yong Jung, Seoul (KR)

(73) Assignee: Hyundai Mobis Co., Ltd., Seoul (KR)

( * ) Notice: Subject to any disclaimer, the term of this patent is extended or adjusted under 35 U.S.C. 154(b) by 279 days.

(21) Appl. No.: 14/708,876

(22) Filed: May 11, 2015

(65) Prior Publication Data

US 2015/0323608 A1 Nov. 12, 2015

(30) Foreign Application Priority Data

May 12, 2014 (KR) .......................... 10-2014-0056454

(51) Int. Cl.
*G01R 31/00* (2006.01)
*G06F 11/00* (2006.01)
(Continued)

(52) U.S. Cl.
CPC ............ *G06F 11/00* (2013.01); *G01R 19/165* (2013.01); *G01R 31/007* (2013.01);
(Continued)

(58) Field of Classification Search
CPC ........ G06F 11/00; G06F 11/26; G01R 19/165
(Continued)

(56) References Cited

U.S. PATENT DOCUMENTS 5,873,089 A * 2/1999 Regache .................. G06F 5/06
2006/0221697 A1* 10/2006 Li ........................ G11C 16/3468
365/185.18

(Continued)

FOREIGN PATENT DOCUMENTS

CN 101825688 A 9/2010
CN 102473878 A 5/2012
(Continued)

OTHER PUBLICATIONS

Chinese Office Action dated Jul. 27, 2017 in corresponding Chinese Patent Application No. 201510217362.0 (7 pages in Chinese).

Primary Examiner — Anthan Tran
(74) Attorney, Agent, or Firm — NSIP Law

(57) ABSTRACT

Provided is an intelligent battery sensor for a vehicle which detects an overcurrent module generating an abnormal overcurrent within a vehicle. The intelligent battery sensor for a vehicle includes a data packetizing unit configured to extract internal data variables related to detection of an overcurrent module and packetize the extracted internal data variables, a volatile memory configured to temporarily store the packetized internal data variables, a fault and validity diagnosing unit configured to monitor the packetized internal data variables stored in the volatile memory and classify, when a diagnostic trouble code (DTC) related to the abnormal overcurrent is diagnosed, the packetized internal data variables with respect to a diagnosis time of the DTC, and a nonvolatile memory configured to store the classified internal data variables under the control of the fault and validity diagnosing unit.

13 Claims, 5 Drawing Sheets

(51) Int. Cl.
    *G01R 31/36*     (2006.01)
    *G01R 19/165*    (2006.01)
    *G06F 1/26*      (2006.01)
    *G06F 11/07*     (2006.01)
    *G06F 11/30*     (2006.01)

(52) U.S. Cl.
    CPC ..... *G01R 31/3606* (2013.01); *G01R 31/3648* (2013.01); *G06F 1/26* (2013.01); *G06F 11/0739* (2013.01); *G06F 11/0778* (2013.01); *G06F 11/30* (2013.01)

(58) Field of Classification Search
    USPC .......................................................... 702/58
    See application file for complete search history.

(56) References Cited

U.S. PATENT DOCUMENTS

2010/0079271 A1\*   4/2010   Hsu ....................... B60L 3/0046
                                             340/455
2010/0244847 A1   9/2010   Kudo et al.
2011/0025273 A1   2/2011   Lattin
2011/0306894 A1\*  12/2011   Spaulding ............ A61B 5/0006
                                             600/515
2012/0175953 A1   7/2012   Ohkawa et al.
2012/0286575 A1  11/2012   Park et al.
2014/0117939 A1\*   5/2014   Lim .................... H01M 10/482
                                             320/134
2014/0159739 A1   6/2014   Kudo et al.
2016/0303977 A1  10/2016   Kudo et al.

FOREIGN PATENT DOCUMENTS

CN       102714419 A    10/2012
JP        2011-142036 A   7/2011
KR    1020150037143 A   4/2015

\* cited by examiner

INTELLIGENT BATTERY SENSOR FOR VEHICLE AND METHOD OF STORING DATA IN SENSOR

CROSS-REFERENCE TO RELATED APPLICATIONS

This application claims priority under 35 U.S.C. § 119 to Korean Patent Application No. 10-2014-0056454, filed on May 12, 2014, the disclosure of which is incorporated herein by reference in its entirety.

TECHNICAL FIELD

The present invention relates to a battery sensor for a vehicle and a method of storing data using the same.

BACKGROUND

FIG. 1 is a view illustrating a related art vehicle battery sensor system.

Referring to FIG. 1, the related art vehicle battery sensor system 50 includes a vehicle battery 10, an intelligent battery sensor (IBS) 20, an engine controller (or an engine management system (EMS)) 30, and a vehicle load 40.

A positive terminal (+) of the vehicle battery 10 is electrically connected to the vehicle load 40, and a negative terminal (−) of the vehicle battery 10 is electrically connected to one terminal of a shunt resistor 15.

The IBS 20 is electrically connected to the negative terminal (−) of the vehicle battery 10 through the other terminal of the shunt resistor 15.

The IBS 20 monitors a voltage and a current of the vehicle battery 10 using a current flowing in the shunt resistor 15 and a voltage difference between both ends of the shunt resistor 15. Although not shown, the IBS 20 may monitor an internal temperature, or the like, using an internal temperature sensor.

Monitored information items are transferred to the engine controller 30 according to a local interconnect network (LIN) communication 25.

The engine controller 30 checks a status of the vehicle battery 10 using the received information and adjusts the vehicle load 40 according to a checking result.

The vehicle load 40 is connected between the positive (+) terminal of the vehicle battery 10 and a vehicle chassis serving as a ground GND. The vehicle load 40 includes a generation load G 42 such as a generator or an alternator, a large current motor driving load M 44 such as a motor-driven power steering (MDPS), an anti-lock breaking system (ABS), or an air suspension (AirSUS), and an electrical load L 46 such as a headlight lamp, or the like.

The related art vehicle battery sensor system 50, however, does not have a scheme of establishing (or investigating or finding) causes of a fault by itself when the fault occurs.

SUMMARY

Accordingly, the present invention provides an intelligent battery sensor (IBS) for a vehicle capable of establishing a cause of a fault due to an error of an operation thereof, and a method of storing data in the sensor.

In one general aspect, an intelligent battery sensor for a vehicle which detects an overcurrent module generating an abnormal overcurrent within a vehicle includes: a data packetizing unit configured to extract internal data variables related to detection of an overcurrent module and packetize the extracted internal data variables; a volatile memory configured to temporarily store the packetized internal data variables; a fault and validity diagnosing unit configured to monitor the packetized internal data variables stored in the volatile memory and classify, when a diagnostic trouble code (DTC) related to the abnormal overcurrent is diagnosed, the packetized internal data variables with respect to a diagnosis time of the DTC; and a nonvolatile memory configured to store the classified internal data variables under the control of the fault and validity diagnosing unit.

In another general aspect, a method of storing data in an intelligent battery sensor for a vehicle which detects an overcurrent module generating an abnormal overcurrent within a vehicle includes: extracting internal data variables related to detection of the abnormal overcurrent, and packetizing the extracted internal data variables; storing the packetized internal data variables in a volatile memory; monitoring the packetized internal data variables stored in the volatile memory, and diagnosing whether a diagnostic trouble code (DTC) related to the abnormal overcurrent has been generated; when the DTC is diagnosed, classifying the packetized internal data variables with respect to a diagnosis time of the DTC; and storing the classified internal data variables in a nonvolatile memory.

Other features and aspects will be apparent from the following detailed description, the drawings, and the claims.

DETAILED DESCRIPTION OF EMBODIMENTS

Hereinafter, embodiments of the present invention will be described in detail with reference to the accompanying drawings.

The present invention provides a method of establishing a cause of a fault due to an overcurrent of a vehicle or an operational error of an intelligent battery sensor (IBS).

Major data of an IBS is periodically monitored. The monitored major data of the IBS is classified into immediately previous data and immediately subsequent data with respect to a fault diagnosis time, temporarily stored in a nonvolatile memory according to a circular queue linked list, and subsequently transferred to a nonvolatile member (NVM).

The circular queue linked list applied in the present invention may effectively use a memory in an embedded system having a limited memory with small capacity.

When the method is applied, power is separated and transferred to an analysis center, as well as the spot in the occurrence of an accident or failure, a situation before and after a time of a fault may be analyzed by reading stored data, and time required for establishing causes of the fault may be shortened.

Hereinafter, an embodiment of the present invention will be described in detail.

Figure 1:
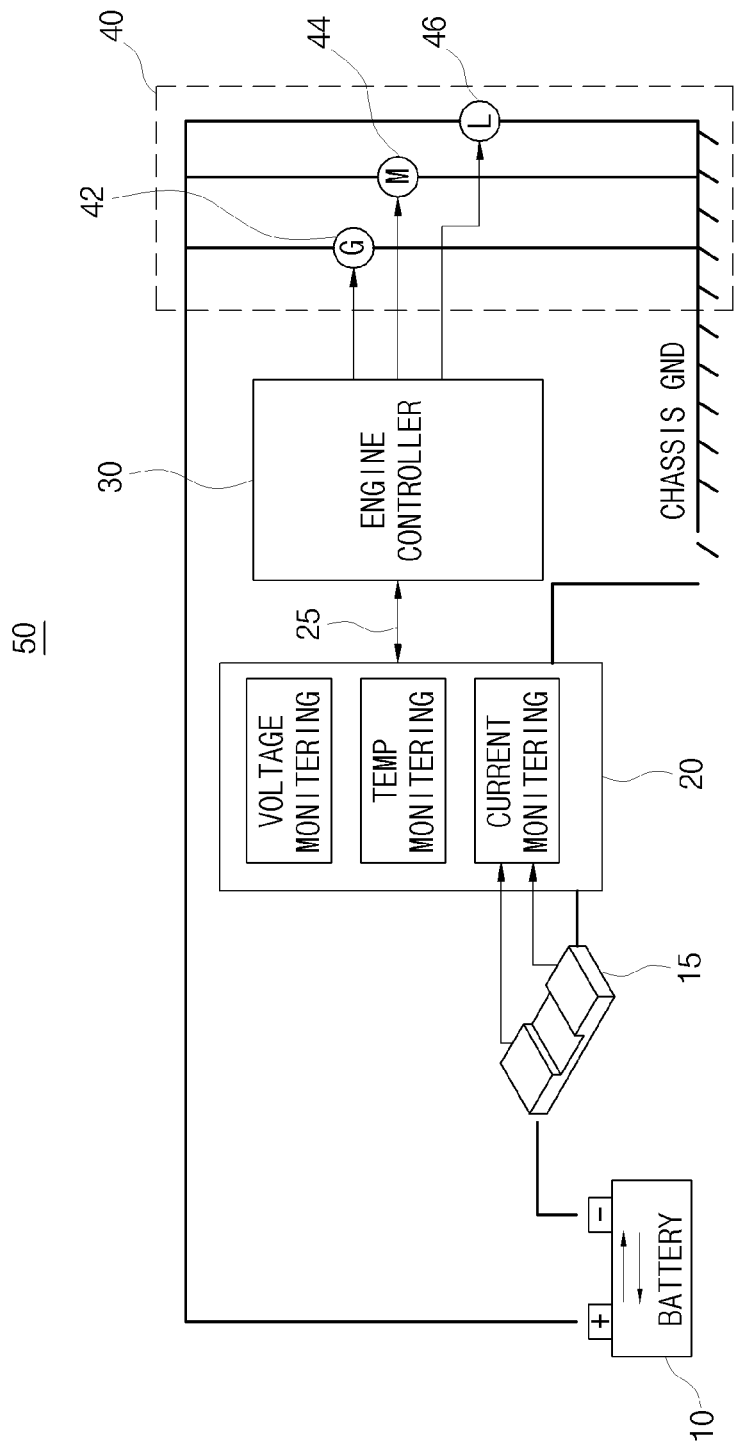
FIG. 1 is a view illustrating a related art battery sensor system for a vehicle.
Figure 2:
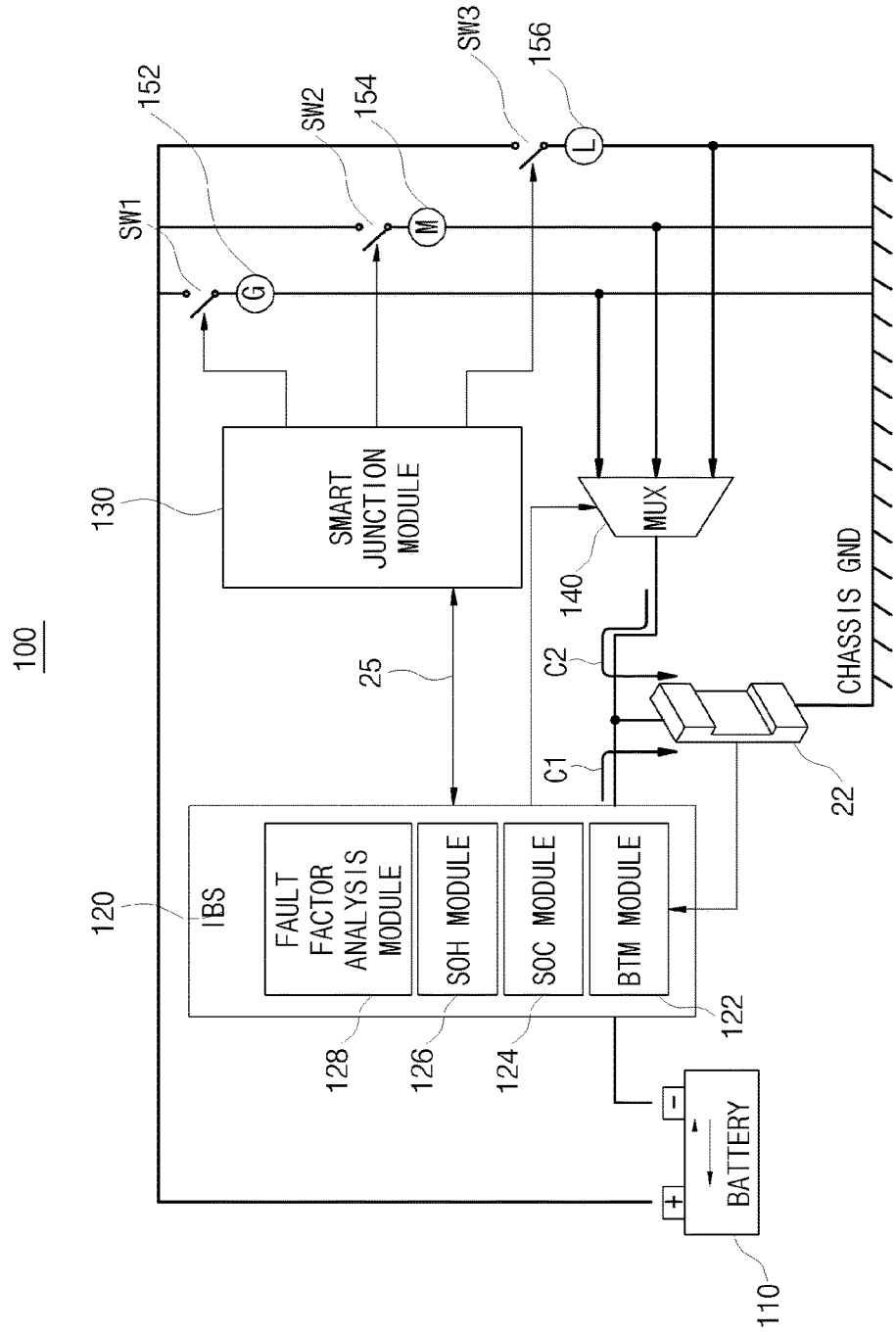
FIG. 2 is a block diagram illustrating a battery sensor system for a vehicle according to an embodiment of the present invention.

FIG. 2 is a block diagram illustrating a battery sensor system for a vehicle according to an embodiment of the present invention.

Referring to FIG. 2, a battery sensor system 100 for a vehicle includes a vehicle battery 110, an intelligent battery sensor (IBS) 120, a smart junction module (or a smart junction box (SJB)) 130, and vehicle loads 152, 154, and 156.

A negative (−) terminal of the vehicle battery 110 is electrically connected to the IBS 120, and a positive (+) terminal of the vehicle battery 110 is connected to switches SW1, SW2, and SW3 designed in front stages of the vehicle loads 152, 154, and 156 in parallel.

The IBS 120 monitors whether an overall load current C1 of a vehicle is an overcurrent. When an overcurrent is detected, the IBS 120 controls a multiplexer 140 to individually monitor currents C2 of the vehicle loads 152, 154, and 156.

When a corresponding vehicle load (hereinafter, referred to as an "overcurrent module") in which an overcurrent is generated for a period of time equal to or greater than a preset period of time, the IBS 120 transfers information regarding the detected corresponding overcurrent module 152, 154, or 156 to the SJB 130 using vehicle network communication 25. Here, the vehicle network communication may be controller area network (CAN) communication.

In addition to controlling detection of an overcurrent module, when a fault is detected, the IBS 120 analyzes a fault factor, and to this end, the IBS 120 includes a fault factor analyzing module 128. The fault factor analyzing module 128 will be described in detail with reference to FIG. 3.

The SUB 130 recognizes a corresponding overcurrent module according to overcurrent module information from the IBS 120, and cuts off power applied to the recognized overcurrent module. To this end, the SJB 130 transfers a switch OFF signal indicating an OFF operation to the switches SW1, SW2, and SW3 provided between the overcurrent module and the vehicle battery 110.

Figure 3:
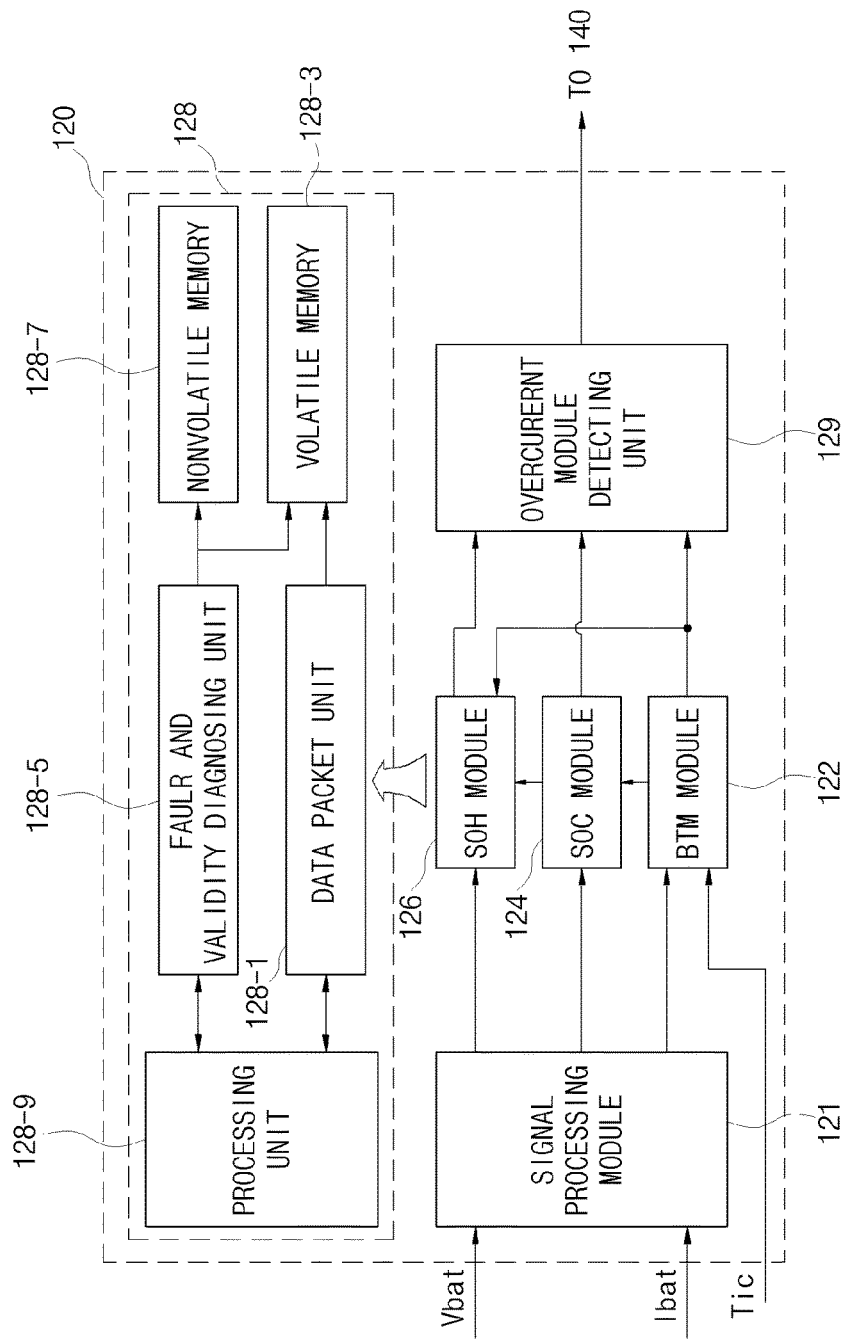
FIG. 3 is a detailed block diagram illustrating an internal configuration of an intelligent battery sensor (IBS) illustrated in FIG. 2.

FIG. 3 is a detailed block diagram illustrating an internal configuration of the IBS illustrated in FIG. 2.

Referring to FIG. 3, the IBS 120 analyzes a fault factor in addition to detection of the overcurrent module.

The fault factor to be analyzed is divided into two types. One is generation of a diagnostic trouble code 9DTC) according to an internal data variable of the IBS 120 and the other is generation of plausibility error of an internal data variable of the BIS.

The IBS 120 determines whether a fault has occurred with respect to the two types of fault factors.

When a fault occurs, the IBS 120 stores (backs up), in the nonvolatile memory, IBS internal data variables (i.e., internal data variables of the IBS 120) immediately before and immediately after a point in time at which a fault is diagnosed with respect to the two types of fault factors. Here, the IBS internal data variables are defined as variables directly affecting a calculation process for detecting the overcurrent modules 152, 154, and 156.

Table 1 below shows IBS internal data variables according to an embodiment of the present invention.

TABLE 1

| Classification | Data name | Unit | Resolution | Data size (byte) | validity range |
|---|---|---|---|---|---|
| Internal data variable of IBS input for detection calculation of overcurrent module | Vbat | V | 1 mV | 2 | 6~18 V |
| | Ibat | A | 1 Ma | 4 | −1500~2000 |
| | Tic | ° C. | 0.25° C. | 2 | −40~125 |
| Internal data variable of IBS used for detection calculation of overcurrent module | Vbat_ | V | 1 mV | 2 | 6~18 V |
| | Ibat_ | A | 1 Ma | 4 | −1500~2000 |
| | Tbat | ° C. | 0.5° C. | 2 | −40~105 |
| | Soc | % | 1% | 1 | 0~100 |
| | Soh | % | 1% | 1 | 0~100 |
| | MassCurrent_Flag | — | state | 1 | 0.1 |

The IBS 120 includes a signal processing module 121 for detecting an overcurreent module, a BTM module 122, a state of charge (SOC) module 124, a state of health (SOH) module 126, and an overcurrent module detecting unit 129.

The IBS 120 further includes a fault factor analyzing module 128 for storing (backing up) IBS internal data variables immediately before and immediately after a fault diagnosis time in a nonvolatile memory.

The signal processing module 121 receives a voltage Vbat and a current that from the vehicle battery 110, filters, the received voltage Vbat and the received current that, and outputs the filtered battery voltage Vbat_ and the current Ibat_.

The BTM module 122 receives an ASIC temperature Tic and the filtered battery voltage Vbat_ and current that_ and monitors an internal temperature of the vehicle battery.

The SOC module 124 receives the filtered battery voltage Vbat_ and current that_ and monitors a charge rate (%) of the vehicle battery.

The SOH module 126 comprehensively determine the filtered battery voltage Vbat_ and current Ibat_ and the charge rate (%) of the vehicle battery monitored by the SOC module 124, to monitor an aging rate (%) of the vehicle battery.

The overcurrent module detecting unit 129 detects an overcurrent module using a current (ADC current) calculated on the basis of the monitoring result values from the BTM module 122, the SOC module 124, and the SOH module 126 and a difference in an across voltage of a shunt resistor 22.

The ADC current calculated on the basis of the difference in the across voltage of the shunt resistor 22 is a current obtained by adding the current C1 of the entire load of the vehicle, that is, a current of the G load 152, a current of the M load 154, and a current of the L load 156 illustrated in FIG. 2.

When the current C1 of the overall load of the vehicle equal to or greater than a preset overcurrent threshold value is continuously detected (when substantially 200 A continues for more than 10 seconds), the overcurrent module detecting unit 129 outputs a control signal for individually detecting the load current C2 flowing in each of the loads 152, 154, and 156, to the multiplexer 140.

The multiplexer 140 selectively transfers the load current C2 flowing in each module to the overcurrent module detecting unit 129 according to the control signal.

The overcurrent module detecting unit 129 analyzes the load current C2 of each module, recognizes an overcurrent module in which an overcurrent flows, and transfers a signal indicating the recognized overcurrent module to the SBJ 130.

The SJB 130 switches off a switch connecting the corresponding overcurrent module and the vehicle battery 110 according to the signal.

The fault factor analyzing module 128 stores (backs up), in the nonvolatile memory, the IBS internal data variables as illustrated in Table 1 affecting the detection calculation of the overcurrent module. Here, the IBS internal data variables stored (backed up) in the nonvolatile memory 128-7 are classified into data variables immediately before and immediately after each diagnosis time of the two types of fault factors described above, and the classified IBS internal data variables are again classified into two types of fault factors and respectively stored in a first storage region (DTC storage region) and a second storage region (validity storage region0 of the nonvolatile memory 128-7.

To this end, the fault factor analyzing module 128 includes a data packetizing unit 128-1, a volatile memory 128-3, a fault and validity diagnosing unit 128-5, a nonvolatile memory 128-7, and a processing unit 128-9.

The data packetizing unit 128-1 extracts the IBS internal data variables directly affecting the detection calculation until the overcurrent module detecting unit 129 detects an overcurrent module, and packetizes the same.

The packetized IBS internal data variables are sequentially stored in a memory queue of the volatile memory 128-3 according to a circular queue linked list technique.

The fault and validity diagnosing unit 128-5 monitors (or inspects) the packetized IBS internal data variables stored in the memory queue of the volatile memory 128-3 in real time, and diagnoses whether a DTC has been generated in the overcurrent module generating an abnormal overcurrent. For example, the fault and validity diagnosing unit 128-5 diagnoses whether a DTC related to a hardware fault of the multiplexer 140 or defective I/O control, a fault in a current sensor such as the shunt resistor, or a fault of a CAN communication line has been generated.

When occurrence of a DTC is not diagnosed, the fault and validity diagnosing unit 128-5 diagnoses a validity error of the IBS internal data variables. Here, the validity error of the IBS internal data variables refer to generation of IBS internal data variables not within the validity range of Table 1.

After the generation of the DTC of the overcurrent module or the validity error (or an error) of the IBS internal data variables are diagnosed, fault and validity diagnosing unit 128-5 classifies a predetermined number of IBS internal data variables, for example, twenty packetized IBS internal data variables immediately before the DTC diagnosis or immediately before the validity error diagnosis and a predetermined number of packetized IBS internal data variables, for example, twenty packetized IBS internal data variables, immediately after the DTC generation or immediately after validity error diagnosis, with respect to the diagnosis time of the DTC of the overcurrent module and the diagnosis time of the validity error of the IBS internal data variables.

The packetized IBS internal data variables immediately before and immediately after the DTC diagnosis or validity error are transferred from the memory queue (or memory buffer) the volatile memory 128-5 to the nonvolatile memory 128-7 and stored therein under the control of the fault and validity diagnosing unit 128-5.

The nonvolatile memory 128-7 is divided into first and second storage regions, and the IBS internal data variables immediately before and immediately after the DTC diagnosis are stored in the first storage region, and the IBS internal data variables immediately before and immediately after the validity error diagnosis are stored in the second storage region.

In this manner, the fault factor analyzing module 128 periodically monitors the IBS internal data variables immediately before and immediately after the fault diagnosis stored in the volatile memory 128-3, and when a fault occurs in a vehicle, the fault factor analyzing module 128 stores the IBS internal data variables immediately before and immediately after the fault diagnosis in the nonvolatile memory 128-7, thereby allowing fault causes to be precisely analyzed.

Even though the nonvolatile memory 128-7 is physically separated from the intelligent battery sensor for a vehicle, the data stored in the nonvolatile memory 128-7 does not become extinct, and thus, the fault factors may be precisely analyzed any time and anywhere.

The volatile memory 128-3 such as a RAM is limited in storage capacity due to a purpose thereof, and thus, a scheme of effectively using storage capacity of the volatile memory 128-3 is required.

Thus, in this embodiment, a method of sequentially storing the IBS internal data variables in the volatile memory using the circular queue linked list as described above may be used.

In the method of sequentially storing data in a computing system, a memory queue using an array list may be utilized. The memory queue using an array list is a scheme of sequentially storing data in a predetermined storage region of the volatile memory 128-3.

Figure 4:
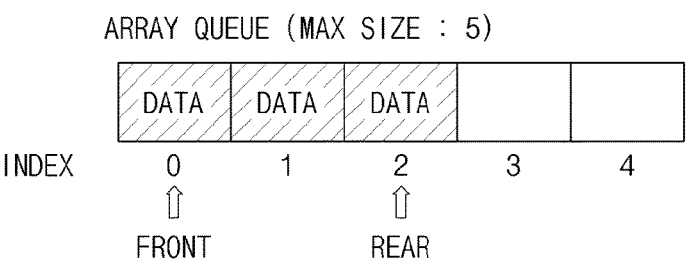
FIGS. 4 and 5 are views illustrating a circular queue linked list technique used in the present invention.

As illustrated in FIG. 4, the array list technique allows for easily referring to data and fast access in managing memory. However, since a memory size should be determined at an early stage, memory loss (overflow) is made, and when data is inserted or deleted, the overall data should be moved.

In particular, utilization of a dynamic allocation scheme available for allocation and release in terms of management of limited storage capacity allows for more effective management. A linked list is a structure complementing the shortcomings of the array scheme.

Figure 5:
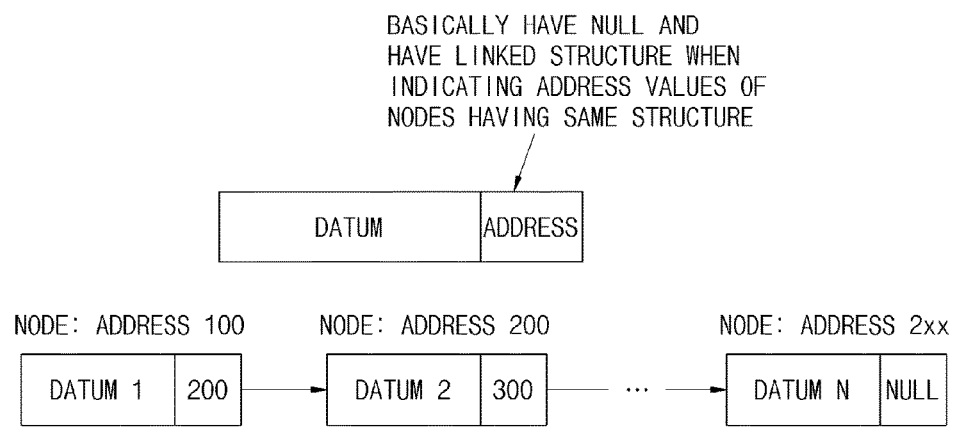

The structure of the linked list is illustrated in FIG. 5.

As illustrated in FIG. 5, the linked list includes a plurality of nodes (Node 1, Node 2, . . . , Node N), and each node includes data (or data bundle) and a link address of other data. A structure of connecting the nodes (Node 1, Node 2, . . . , Node N) is the linked list.

The linked list has a slightly complicated structure, compared with the foregoing array list, but it is free to allocate the number of nodes (Node 1, Node 2, . . . , Node N), namely, memory, and if not necessary, the linked list may be immediately released, reducing memory consumption.

Also, in inserting data, addition/deletion may be performed only with a link address, rather than moving the entirety, allowing for fast processing in terms of controlling.

In an embodiment of the present invention, data may be stored in every 10 ms. Thus, in order to store about 20-byte data node in the volatile memory 128-3 at every 10 ms, theoretically, a memory having infinite storage capacity is required. However, in the data storage scheme according to an embodiment of the present invention, since the IBS internal data variables immediately before and immediately after a fault is generated, only a memory of about 40 nodes, namely, 20 bytes×40 nodes=800 bytes, may be utilized for required data.

The structure of the linked list is designed to promote efficacy of memory management, and thus, the data storage scheme according to an embodiment of the present invention may be simply realized. For example, it may be realized by allowing a link address of the final node (e.g., address 2xx) to indicate the first node address in FIG. 5.

Figure 6:
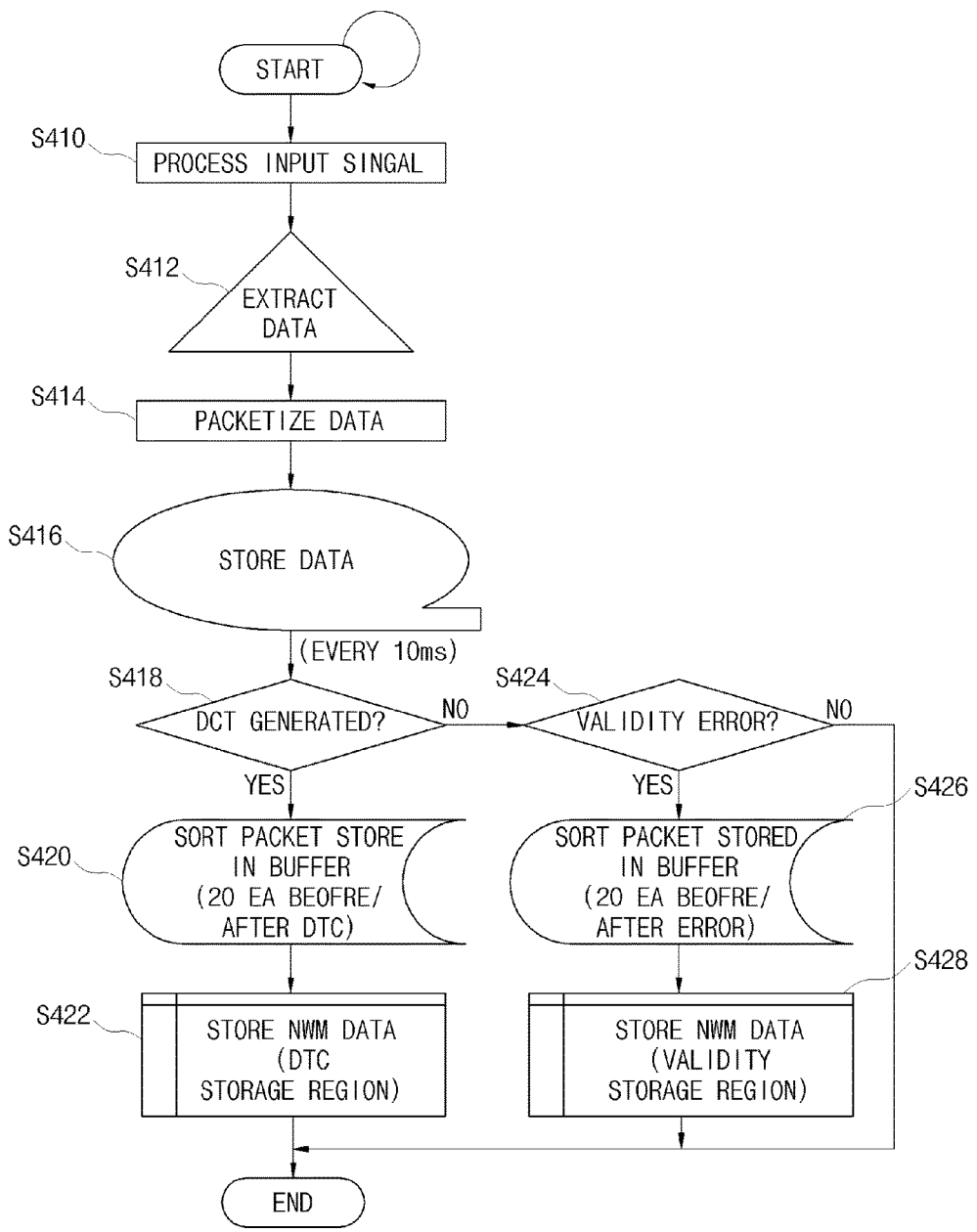
FIG. 6 is a flow chart illustrating a data storage method of analyzing a fault factor according to an embodiment of the present invention.

FIG. 6 is a flow chart illustrating a data storage method of analyzing a fault factor according to an embodiment of the present invention.

Referring to FIG. 6, first, in step S410, an input signal is processed. Here, the input signal is data directly affecting detection calculation of an overcurrent module among the BTM module, the SOC module, and the SOH module.

Next, in step S412, IBS internal data variables used for detecting the overcurrent module in processing the input signal are extracted.

Subsequently, in step S414, the extracted IBS internal data variables are packetized, and in step S416, the packetized IBS internal data variables are sequentially stored in a memory queue of a volatile memory. Here, in order to store the IBS internal data variables in the memory queue, a circular queue linked list technique may be utilized.

Thereafter, in step S418, the packetized IBS internal data variables stored in the memory queue are monitored to diagnose whether a DTC has been generated.

In step S420, when a DTC has been generated, a predetermined number of (e.g., twenty) the packetized IBS internal data variables immediately before the DTC diagnosis time and a predetermined number of (e.g., twenty) the packetized IBS internal data variables immediately after the DTC diagnosis time are sorted.

In step S422, the sorted packetized IBS internal data variables immediately before and immediately after the DTC diagnosis time are stored in a first storage region (DTC storage region0 allocated to a nonvolatile memory.

In step S418, when the DTC has not been generated, in step S424, whether the IBS internal data variables have a validity error is diagnosed.

In step S426, when a validity error of the IBS internal data variables is diagnosed, a predetermined number of the IBS internal data variables immediately before the diagnosis time of the validity error of the IBS internal data variables and a predetermined number of the IBS internal data variables immediately after the diagnosis time of the validity error of the IBS internal data variables are sorted.

In step S428, the sorted IBS internal data variables are stored in a second storage region (validity storage region) of the nonvolatile memory.

So far the configuration of the present invention has been described in detail with reference to embodiments the accompanying drawings, but this is merely illustrative and various modifications may be made without departing from the scope of the present invention. For example, in the embodiment of FIG. 3, the structure in which the volatile memory 128-3 and the validity diagnosing unit 128-5 are separated is illustrated, but the volatile memory 128-3 may be provided within the fault and validity diagnosing unit 128-5. In this case, IBS internal data variables packetized by the data packet unit 128-1 may directly be transferred to the fault and validity diagnosing unit 128-5. Thus, the scope of the present invention should not be determined to be limited to the described embodiments of the present disclosure but be determined by claims and equivalents thereof, as well as claims.

According to the present invention, fault causes due to an IBS operation error may be established by analyzing data stored in a nonvolatile memory within the IBS. Thus, a period of time for establishing fault causes can be shortened. Also, since the limited volatile memory is effectively utilized, the present invention may also be variously applied to establish fault causes of other ECU.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An intelligent battery sensor for a vehicle which detects an overcurrent module generating an abnormal overcurrent within the vehicle, the intelligent battery sensor comprising:
   a data packetizing unit configured to extract internal data variables related to detection of an overcurrent module, and packetize the extracted internal data variables;
   a volatile memory configured to temporarily store the packetized internal data variables;
   a fault and validity diagnosing unit configured to monitor the packetized internal data variables stored in the volatile memory, and classify a first number of the packetized internal data variables immediately before a diagnosis of a diagnostic trouble code (DTC) and a second number of the packetized internal data variables immediately after the diagnosis of the DTC, in response to the diagnosis of the DTC, wherein the DTC is related to the abnormal overcurrent; and
   a nonvolatile memory configured to store the classified first and second numbers of the internal data variables under control of the fault and validity diagnosing unit.

2. The intelligent battery sensor of claim 1, wherein the fault and validity diagnosing unit is further configured to diagnose a validity error for determining whether the internal data variables are outside of a validity range, and to classify the packetized internal data variables with respect to a diagnosis time of the validity error.

3. The intelligent battery sensor of claim 2, wherein the fault and validity diagnosing unit is further configured to classify a third number of the packetized internal data variables immediately before the diagnosis of the validity error and a fourth number of the packetized internal data variables immediately after the diagnosis of the validity error, with respect to the diagnosis time of the validity error.

4. The intelligent battery sensor of claim 3, wherein the nonvolatile memory is further configured to store the classified third and fourth numbers of the internal data variables under control of the fault and validity diagnosing unit.

5. The intelligent battery sensor of claim 3, wherein the nonvolatile memory comprises a first storage region configured to store the classified first and second numbers of the internal data variables, and a second storage region configured to store the classified third and fourth numbers of the internal data variables.

6. The intelligent battery sensor of claim 1, wherein the packetized internal data variables are temporarily stored in the volatile memory according to a circular queue linked list technique.

7. A method of storing data in an intelligent battery sensor for a vehicle which detects an overcurrent module generating an abnormal overcurrent within the vehicle, the method comprising:
- extracting internal data variables related to detection of the abnormal overcurrent, and packetizing the extracted internal data variables;
- storing the packetized internal data variables in a volatile memory;
- monitoring the stored packetized internal data variables, and diagnosing whether a diagnostic trouble code (DTC) related to the abnormal overcurrent is generated;
- classifying a first number of the packetized internal data variables immediately before the diagnosis of the DTC and a second number of the packetized internal data variables immediately after the diagnosis of the DTC, in response to the DTC being diagnosed; and
- storing the classified first and second numbers of the internal data variables in a nonvolatile memory.

8. The method of claim 7, wherein the diagnosing of whether the DTC is generated comprises diagnosing a validity error for determining whether the internal data variables are outside of a validity range, and the classifying comprises classifying the packetized internal data variables with respect to a diagnosis time of the validity error.

9. The method of claim 8, wherein the classifying comprises classifying a third number of the packetized internal data variables immediately before the diagnosis of the validity error and a fourth number of the packetized internal data variables immediately after the diagnosis of the validity error, with respect to the diagnosis time of the validity error.

10. The method of claim 9, wherein the storing comprises storing the classified third and fourth numbers of the internal data variables.

11. The method of claim 9, wherein the storing comprises storing the classified first and second numbers of the internal data variables in a first storage region of the nonvolatile memory, and storing the classified third and fourth numbers of the internal data variables in a second storage region of the nonvolatile memory.

12. The method of claim 7, wherein the storing of the packetized internal data variables in the volatile memory comprises storing the packetized internal data variables in the volatile memory according to a circular queue linked list technique.

13. An intelligent battery sensor for a vehicle which detects an overcurrent module generating an abnormal overcurrent within the vehicle, the intelligent battery sensor comprising:
- a data packetizing unit configured to extract internal data variables related to detection of an overcurrent module and packetize the extracted internal data variables;
- a volatile memory configured to temporarily store the packetized internal data variables;
- a fault and validity diagnosing unit configured to
  - monitor the packetized internal data variables stored in the volatile memory and classify, in response to a diagnostic trouble code (DTC) related to the abnormal overcurrent being diagnosed, the packetized internal data variables with respect to a diagnosis time of the DTC,
  - diagnose a validity error for determining whether the internal data variables are outside of a validity range,
  - classify the packetized internal data variables with respect to a diagnosis time of the validity error, and
  - classify a predetermined number of packetized internal data variables immediately before the diagnosis of the validity error and a predetermined number of packetized internal data variables immediately after the diagnosis of the validity error, with respect to the diagnosis time of the validity error; and
- a nonvolatile memory configured to store the classified internal data variables under control of the fault and validity diagnosing unit.

* * * * *